United States Patent
Liu et al.

(10) Patent No.: US 6,188,604 B1
(45) Date of Patent: Feb. 13, 2001

(54) FLASH MEMORY CELL & ARRAY WITH IMPROVED PRE-PROGRAM AND ERASE CHARACTERISTICS

(75) Inventors: David K. Y. Liu; Kou-Su Chen, both of Fremont; Vei-Han Chan, San Jose, all of CA (US)

(73) Assignee: AMIC Technology, Inc., Santa Clara, CA (US)

( * ) Notice: Under 35 U.S.C. 154(b), the term of this patent shall be extended for 0 days.

(21) Appl. No.: 09/033,106

(22) Filed: Mar. 2, 1998

(51) Int. Cl.$^7$ .................................................. G11C 16/04
(52) U.S. Cl. ........................... 365/185.11; 365/185.24; 365/185.27
(58) Field of Search .................... 365/185.11, 185.24, 365/185.18, 185.15, 185.33, 185.27

(56) References Cited

U.S. PATENT DOCUMENTS

| | | | |
|---|---|---|---|
| 5,642,311 | 6/1997 | Cleveland et al. ................. | 365/185.3 |
| 5,742,541 | * 4/1998 | Tanigami ......................... | 365/185.18 |
| 5,877,524 | * 3/1999 | Oonakado ........................ | 365/185.18 |
| 5,894,438 | * 4/1999 | Yang ................................ | 365/185.18 |
| 5,963,476 | * 10/1999 | Hung ............................... | 365/185.22 |

OTHER PUBLICATIONS

Endoh, T. et al., "New Write/Erase Operation Technology for Flash EEPROM Cells to Improve the Read Disturb Characteristics," *IEDM*, Apr. 1992, pp. 603–606.

Oyama, K. et al., "A Novel Erasing Technology for 3.3V Flash Memory with 64 Mb Capacity and Beyond," *IEDM*, Apr. 1992, pp. 607–610.

Miyawaki, Y. et al., "A New Erasing and Row Decoding Scheme for Low Supply Voltage Operation 16Mb/64Mb Flash EEPROMs," Symposium on VLSI Circuits, 1991, pp. 85–86.

* cited by examiner

*Primary Examiner*—A. Zarabian
(74) *Attorney, Agent, or Firm*—Law Plus; Peter Courture

(57) ABSTRACT

A circuit and method for achieving an improved pre-programming of flash memory cells is disclosed. The invention, when used to condition flash memory cell arrays, results in increased endurance of such arrays, and eliminates the need for hot electron pre-programming operations. By eliminating the need to pre-program the memory array with hot electrons, the invention provides a signicant improvement for flash arrays, because device life and reliability is extended. In addition, pre-programming time and power is reduced significantly since the operation takes place on a sector (parallel) basis rather than a single bit line (serial) basis, and a charge pump is not needed to generate the current injected into floating gates of cells in the sector.

31 Claims, 3 Drawing Sheets

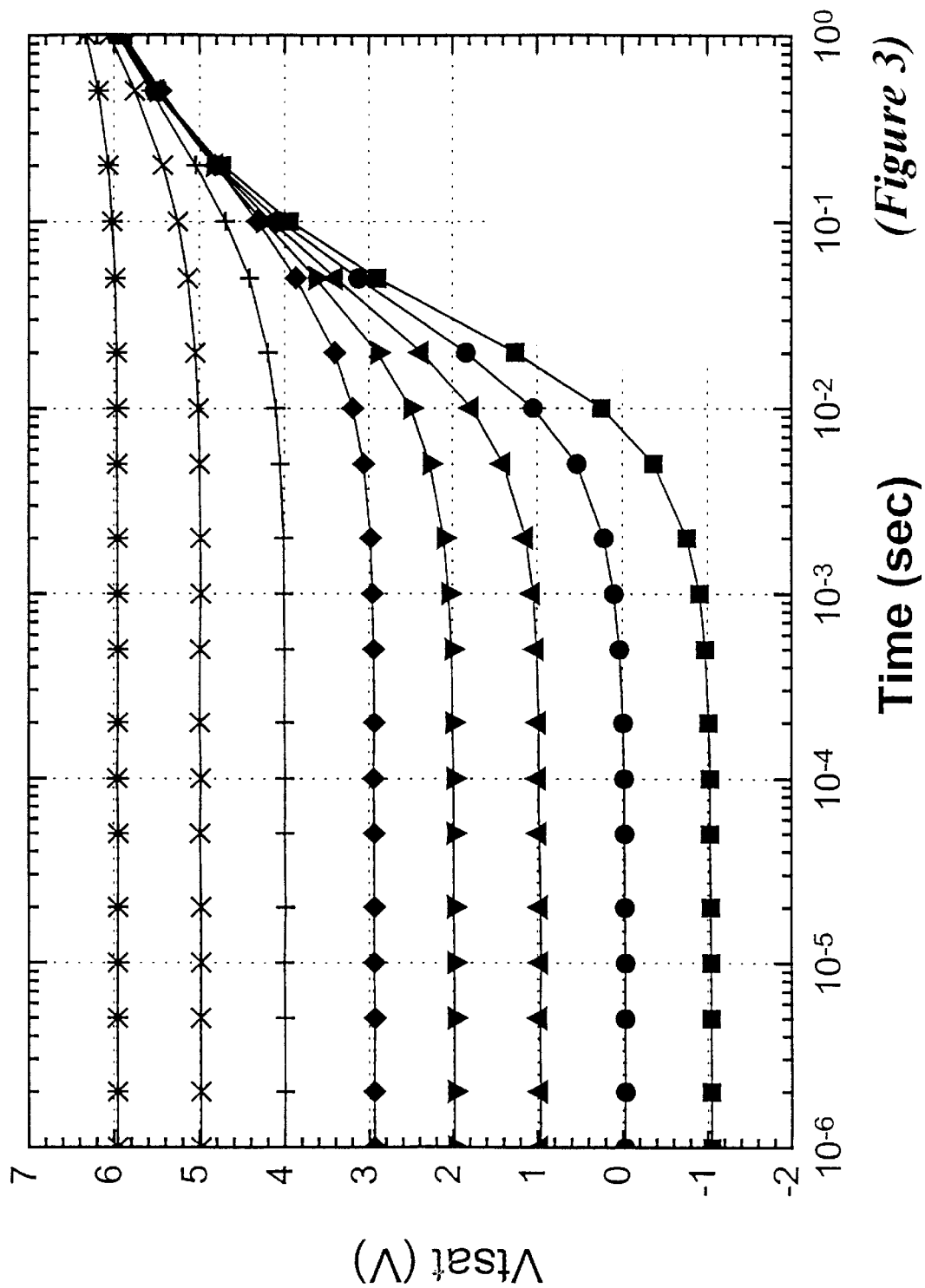

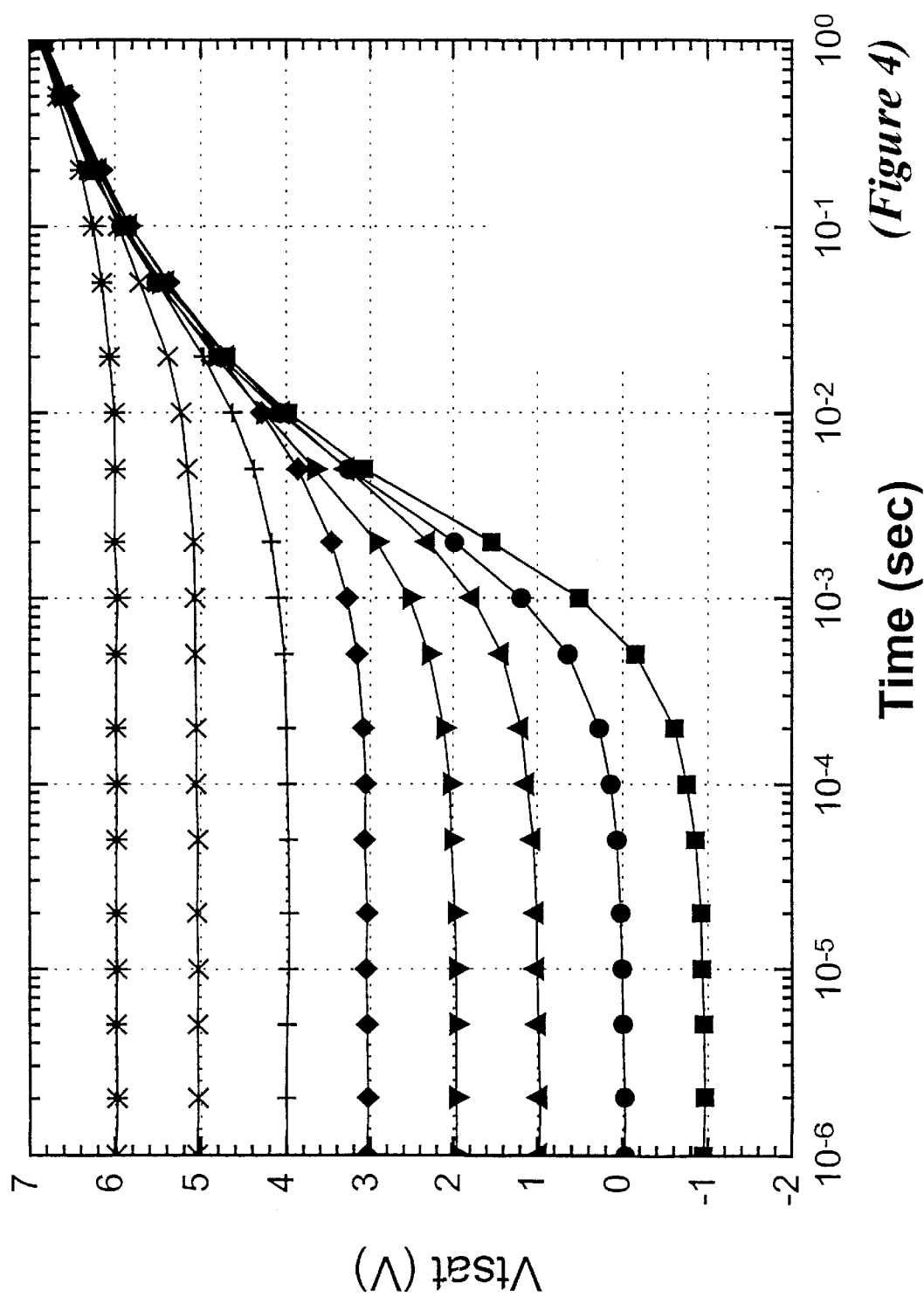
*(Figure 4)*

FLASH MEMORY CELL & ARRAY WITH IMPROVED PRE-PROGRAM AND ERASE CHARACTERISTICS

FIELD OF THE INVENTION

The present invention relates to flash memory cell structures and methods that facilitate more efficient pre-programming and erasing of cells in flash memory arrays. The disclosed embodiments improve reliability and durability of such cells and reduce time and power requirements for pre-programming and erase operations in flash memory cell arrays.

BACKGROUND OF THE INVENTION

Flash EPROM is differentiated from EPROM by the fact that Flash devices can be programmed and erased up to a guaranteed multiple number of times, whereas EPROM can only be programmed one time. In typical operation of Flash EPROM, programming, or writing, of the memory array is done on a byte-by-byte (or bit-by-bit) basis; in contrast, erasing (or resetting) of the memory array is done on a global (whole block) basis. Various sophisticated in-circuit algorithms are typically employed by Flash manufacturers to ensure that the Flash memory array can be reliably programmed and erased for a high number of erase cycles (typically>100,000 cycles). It has been found that the number of achievable program/erase cycles is directly correlated to the threshold voltage distribution of the erased bits. In other words, the greater the disparity in threshold voltages between cells, the fewer the number of available program/erase cycles. This is due to the fact that over-erased bits can cause difficulty in subsequent re-programming of the memory array, and this results in failure of the entire device. In addition, over-erased bits can potentially have high enough leakage current to cause a false reading when sensing of data is done on neighboring bits sharing the same bit line, even if these neighboring bits are at high $V_t$. Therefore, efforts in the field of Flash programming research have focused on tightening the $V_t$ distribution of the memory array after erase operation.

In most of the prior art, to facilitate a tight erase $V_t$ distribution, all the memory cells are first programmed before commencing an erase operation. This programming operation, commonly known as "pre-programming", is performed to ensure that all the cells are at a uniformly high $V_t$ before they are then globally erased. This pre-program operation can be thought of as a pre-conditioning of the array prior to erase operation. The theory underlying this approach is based on an assumption that if pre-programming is not done before an erase operation, then cells with stored electrons or data will be at a high $V_t$, while cells without stored electrons or data will be at a low $V_t$ at the beginning of the erase operation. This relatively wide $V_t$ distribution at the beginning of an erase operation will translate into a wide erased $V_t$ distribution at the end of the same operation. If instead all the cells are placed at a uniformly high $V_t$ prior to an erase operation, the occurrence of some of the bits having over-erasure problems is minimized. Thus the benefits of pre-programming are well-understood in the art, including the fact that it results in enhancement of the overall reliability of a Flash memory array.

To effectuate a pre-programming (conditioning) operation, the prior art typically uses the same mechanism as used in a normal array programming operation. Currently, the most preferred method for programming, and thus for pre-programming, is the use of Channel Hot Electron Injection, or CHEI. This method typically takes about 3–10 μs per bit, with each bit consuming about a peak current of 300 μA. The operation typically is done one byte, or 8 bits, at a time, until a whole sector is pre-programmed.

Unfortunately, the use of CHEI for pre-programming can exacerbate another degradation mechanism of flash cells. In particular, CHEI involves the use of high energy (hot) electrons. These hot electrons, along with the hot holes they generate in the channel of the device, can severely degrade the trans-conductance (known as Gm), and thus limit the current handling capability of the Flash memory cell. As is to be expected, this effect is more pronounced as the channel length of the Flash cell is progressively scaled downward. As currently understood, the Gm degradation mechanism is irreversible. A Flash memory cell with a severely degraded Gm will yield significantly reduced current during reading, and this results in yet another failure mechanism for the memory array.

In addition, the CHEI mechanism tends to saturate at a high threshold voltage, on the order of the control gate voltage ($V_{pp}$) of the cell. Thus, even if a pre-programming operation is performed to ostensibly set threshold voltages at a value of $V_{tp}$, the threshold voltage distribution at end of such pre-programming can nevertheless have a range between $V_{tp}$ and $V_{pp}$. In some common applications, this distribution can still be as wide as 3 volts, which is excessive and can lead to further mis-operation of the device.

Yet another drawback of using CHEI for pre-programming is that as the supply voltage for the technology is scaled down below 3V, it takes progressively longer to perform the pre-program operation (and thus an erase operation as well). This is because the CHEI mechanism is not easily scalable with supply voltage. During a CHEI pre-programming operation, the drain of the cell being pre-programmed must be charge pumped to a higher voltage than the source voltage; typically this difference is in excess of 4.5 volts. Consequently, instead of being capable of performing pre-program of 8 bits simultaneously, the pre-program operation might need to be done with less than 4 bits at a time. This in effect doubles the time required for pre-programming. Furthermore as cell sizes are scaled down, a large amount of current is consumed in supply the charge pump, making this prior art method even less efficient. To compensate against this effect, the charge pump must be made larger in order to supply the same amount of current for a reduced voltage. This trend would only get worse as the supply voltage is further scaled to 1.8V and below, and the die size increases.

It can be seen therefore that the goal of decreasing the charge pump size (to scale it proportionately in accordance with the memory cell array) is not realized easily in practice because to do so defeats the goal of keeping (or certainly improving) the pre-program (erase) times. Thus, to maintain the same erase speeds, a proportionately larger (relative to the cell size) charge pump is required, and this results in overall reduced device integration density, higher fabrication costs, etc.

Accordingly, there is a substantial need for a pre-programming mechanism that does not significantly degrade device performance, and that provides a tighter $V_t$ distribution after a pre-programming operation. In addition, it is extremely desirable for such pre-programming method to be easily scalable with the supply voltage of flash devices.

SUMMARY OF THE INVENTION

An object of the present invention, therefore, is to provide a method of pre-programming that eliminates the need for deleterious CHEI operations in flash memory arrays.

A further object of the present is to improve the reliably and durability of cells in a flash array so that device failures are reduced.

Yet another object of the present invention is to provide a flash memory array and pre-programming method that require less time and power to perform a pre-programming operation.

Another object of the present invention, is to provide a method of pre-programming that yields a safer, faster and more reliable erase operation for flash memory array.

Another purpose of the present invention is to provide a flash memory array structure and pre-programming method that is easily scalable with device size and voltage supply.

An additional objective of the present invention is to provide a flash memory array structure and pre-programming method that effectuates a pre-programming operation on a global (sector) basis so that the time for pre-programming of such array is invariant by sector size.

These and other objectives are accomplished by locating a memory cell in a first well of a first conductivity type, and then situating the first well within a second well of a second conductivity type. Through suitable biasing of the cell, and first and second wells, a bipolar pre-programming current can be injected from the second well into a floating gate of the cell. Since cells within any logical sector all share the same geometric well, pre-programming can be accomplished essentially simultaneously for any other memory cells within the same sector as said cell. This fact results in remarkably faster pre-programming times (on the order of 100 ms per sector, which for a typical device corresponds to less than 2 microseconds per cell in such sector). Moreover, since the inventive method relies on an injected current from the substrate, hot electrons are not generated in the cell channel, and this improves reliability and durability of a device utilizing such cell structures. Furthermore, because the present invention does not use a charge pump to generate the pre-programmed injected current, this further improves device integration density and power considerations.

The inventive process can be embedded in conventional fashion in a control circuit typically employed in flash devices for programming cells by adjusting the threshold voltages of the cells.

BRIEF DESCRIPTION OF THE DRAWINGS

FIG. 3 is a graphical chart showing how threshold voltages of cells that vary significantly prior to pre-programming in a flash memory array with a well bias of 0.7 nevertheless converge rapidly in time after the pre-programming method of the present invention is employed;

FIG. 4 is similar to FIG. 3, except that a well bias of 0.9 volts is utilized for the graphical comparison.

DETAILED DESCRIPTION OF THE INVENTION

Figure 1:
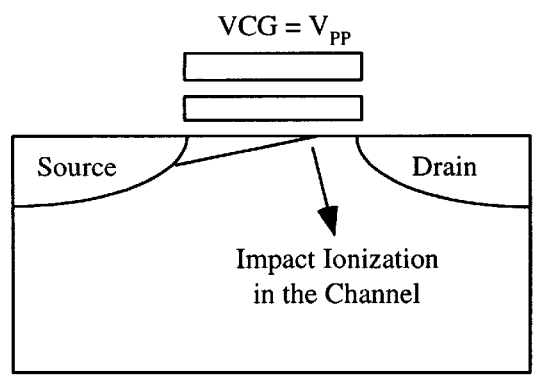
FIG. 1 depicts a conventional Flash memory cell as it is biased during a prior art pre-programming operation.

FIG. 1 illustrates how a Flash memory cell is biased during a typical prior art pre-programming operation. This bias condition is the same as during a programming operation, and, as explained above, relies on a charge pump to maintain a drain-source differential of approximately 4.5 volts or greater to induce CHEI. An individual cell draws about 350–500 $\mu A$ of peak current during pre-programming for a duration of 3 $\mu s$ to 10 $\mu s$. The total programming time for a whole sector of 64 Kybte, using optimistic values, would be approximately given by the formula:

The total current supplied to 8 bits lines therefore is around 3–4 mA. This does not include the current consumed by the charge pump to supply the drain current to the cell. It can be seen immediately that this method is inefficient for a number of reasons, including the fact that it is performed in a serial manner, and therefore the time and power required increases directly as a function of device size. Furthermore, as the voltage of the array is reduced from generation to generation, the size of the charge pump must increase proportionately in order to supply the same amount of programming current. The only way to counteract against this effect is to program fewer cells at a time, and thus device pre-programming, erase operations take significantly longer. This latter effect, of course, is equally undesirable and becomes exacerbated with increasing array sizes.

Figure 2:
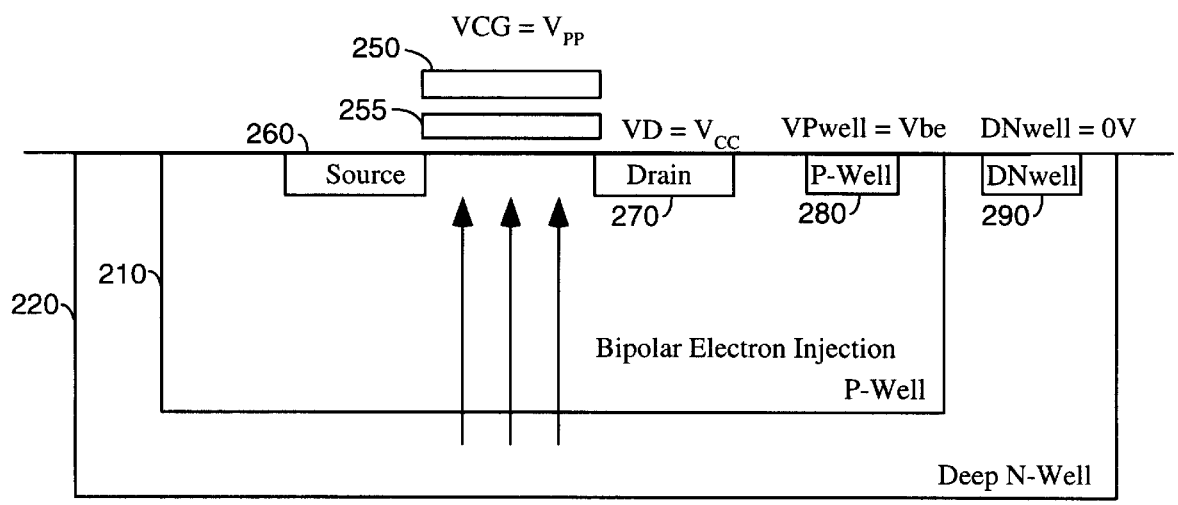
FIG. 2 illustrates flash memory array structure and general operational characteristics of a programming method employed in the present invention.

FIG. 2 illustrates a preferred embodiment of a Flash memory cell array structure that is most suitable for a new method of pre-programming that eliminates many of the adverse effects associated with CHEI. In this embodiment, a Flash memory cell array is situated inside a P-Well 210 in turn located within a deep N-Well 220. This diagram figure also illustrates how the flash array structure should be biased during a pre-programming operation employed in the preferred method of the present invention. As can be seen from the figure, P-Well 210 is forward biased with respect to deep N-Well 220, with drain 260 and/or source 270 of the Flash cell biased at $V_{cc}$. In essence, it can be seen that this arrangement effectuates a bipolar transistor configuration with P-Well 210, deep N-Well 220, and drain 260 and/or source 270 of the Flash memory cell being the base, emitter, and collector respectively. In one sense, since the floating gate is also positively biased with a voltage $V_{pp}$ (typically between 8.5 to 9 volts), it can be considered a collector of the bipolar transistor as well. Under these bias conditions an electron current flows from N-well 220, passing through P-well 210 and is then injected into floating gate 255, thus placing such cell in a pre-programmed state. The structure of FIG. 2 can be manufactured using a number of well-known conventional semiconductor manufacturing techniques. While FIG. 2 depicts a preferred embodiment of the present invention, it will be apparent to those skilled in the art that other suitable array geometries and structures, bias conditions and signal timing variations can be utilized for achieving the electron injection that pre-programs the flash cells. For example, another well geometry could be used, or alternatively, in lieu of a bipolar configuration, a single carrier embodiment could be implemented with a parasitic MOSFET structure configured in any one of many known methods. The key aspect of the present invention lies in the fact that it relies on a pre-programming mechanism that is substantially less harsh than conventional CHEI techniques so that device reliability is enhanced. Moreover, the present invention also does not rely on Fowler-Nordheim tunneling, another commonly used technique for programming and erasing memory cells which unfortunately has a number of significant process and structure requirements that make it difficult to scale as device size and channel lengths decrease. These include the fact, of course, that FN tunneling requires an extremely large field in the oxide layer—typically greater than 10 MV/cm to be effective—and this results in abbreviated device lifespan as well from oxide breakdown effects.

FIG. 3 illustrates the improved pre-programming performance of the present electron injection method. In this graph, different initial threshold voltages are used to represent a wide initial $V_t$ distribution for the cells in an array prior to pre-programming. In other words, the different symbols (squares, circles, etc.) represent cells having different initial $V_t$ levels; for example, the curve made of interconnected diamond shapes illustrates the behavior of cells having an initial threshold voltage of 3 volts. From the figure, it is seen that the $V_t$ distribution decreases from about 7V in variation initially (i.e., from −1 Volt to +6 volts) to less than 2V (i.e., from about +4 to +6 volts) after about 100 ms of pre-programming, and a Vt distribution of around 1V can be obtained after about 200 ms of pre-programming. This configuration assumes a P Well 210 bias of 0.7V ($V_{be}$). At a P Well 210 bias of 0.9V, it is seen from FIG. 4 that the $V_t$ distribution decreases from 7V initially to less than 2V after about 10 ms of pre-programming. After 100 ms of pre-programming, the $V_t$ distribution decreases further to less than 1 volt.

After this first portion of an erase operation is completed (pre-programming is only typically used as part of an erase procedure) a subsequent threshold reducing (erasing) signal can be applied to the cells in a second operation to place them into a fully erased step. This can be done in any number of well-known ways, and it can be seen that the overall erase operation thus takes place in a faster and more reliable fashion than that of prior art methods. Subsequent to this operation, the device is ready for programming with user data again using any conventional techniques, including FN, CHEI, etc.

To those skilled in the art it will be clear that this mechanism of pre-programming (erasing) does not rely on channel hot electrons that are produced by impact ionization in the channel region. Thus the electrons that are injected into the floating gate with this mechanism will not introduce significant device trans-conductance degradation. Experimental measurements performed on an embodiment of the type shown in FIG. 2 suggest that this bipolar electron injection mechanism consumes about 1 mA to 10 mA for pre-programming a whole sector of the Flash memory array. Compared to the prior art, it can be seen that the time for programming a cell in the present invention is essentially invariant, even with increasing array sizes. For a 64 Kbyte device, the present invention yields a figure of merit of less than approximately 1 $\mu$sec of pre-programming time per cell, which is substantially less than that of the prior art. While not confirmed at this time, the amount of current required for the present invention pre-programming operation is expected to increase slightly with larger sector sizes (because of a larger area to be mass-programmed). Looking at yet another performance benchmark of Time*Current, for a given sector size (i.e., an array of cells) the prior art has a figure of merit of 3 $\mu$s/cell*350 $\mu$A/cell (using the generous values above) which is 3 to 5 times worse than the present invention which yields 1 $\mu$sec/cell* 200 $\mu$A/cell. Moreover, since the present invention performs a pre-program operation on an entire sector, it is easily scaled to smaller supply voltages and denser sectors.

Furthermore, in contrast to the prior art, the present invention achieves greater device integration density and flexibility because it does not require a charge pump to generate the pre-programming voltage. This is due to the fact that the small bias voltage $V_{be}$ on the P Well 210 is sufficient to supply the requisite bipolar current. This fact has been confirmed at least preliminarily in experiments conducted by the applicants in which it was discovered that varying the voltage at the source drain terminals did not change the amount of injected current into the floating gate.

Thus, while the details of the physical mechanism are not entirely known to applicants, it appears that the charge pump terminals merely provide extra energy to the electrons of the injected current, and do not provide an additional source of current itself.

It is evident that a flash memory device integrated circuit can be manufactured using conventional processing means to include a control circuit for effectuating the above bias signals in the manner described above. Such article of manufacture could include a control circuit for generating the appropriate timed bias signals for the cells and wells, taken in combination with a typical flash memory cell array and conventional supporting peripheral circuitry (power supplies, address decoders, I/O data buffers, sense amplifiers, reference arrays, counters, timers, etc.). Such control circuit, processing means and peripheral circuitry can be implemented using any of a number of structures and methods well-known in the art, and are therefore not described here in substantial detail. In any event, finished integrated circuit articles embodying the present invention will exhibit superior performance since better, more uniform voltage threshold populations will be effectuated during operation of the device in the field.

The above routines for implementing the inventive processes are provided merely by way of example, and are not intended to be limiting of the present invention in any respect. Other variations of the routines will become evident to those skilled in the art based on the teachings herein. Accordingly, it is intended that the all such alterations and modifications be included within the scope and spirit of the invention as defined by the following claims.

What is claimed is:

1. A method of pre-programming a memory cell in a flash memory cell array, said cell including a floating gate, a control gate, and a source connected through a channel to a drain, said cell further being situated within a first well having a first conductivity type, and said first well being situated within a second well having a second conductivity type, said method including the step of:

biasing said first well, said second well and said cell such that a current is caused to flow from said second well through such first well and is injected into said floating gate, said current being generated so that hot electron generation is reduced;

wherein said current is used for pre-programming said cell so that the cell can be pre-programmed substantially without using hot electrons.

2. The method of claim 1, wherein said floating gate, source and drain of said cell are positively biased during said pre-programming.

3. The method of claim 1, wherein said pre-programming is accomplished essentially simultaneously for any other memory cells within the same sector as said cell.

4. The method of claim 3, wherein said pre-programming is effectuated by injecting current on a sector basis into floating gates of memory cells in such sector.

5. The method of claim 3, wherein pre-programming of the cells in such sector is accomplished in less than 2 microseconds per cell in such sector.

6. The method of claim 1, wherein said cell operates a nominal voltage less than or equal to 3 volts, and said pre-programming does not use a charge pump to generate the pre-programmed injected current.

7. The method of claim 1, further including a step of applying a conditioning signal to reduce a voltage threshold of said cell so that it is placed into an erased state.

8. The method of claim 7, further including a step of applying a data programming signal to said cell to place it into a programmed state corresponding to a value to be stored in said cell.

9. The method of claim 1, wherein said pre-programming current is bipolar.

10. A method of controlling a distribution of threshold voltages of memory cells in a sector of a flash memory cell array, each of said cells in said sector including a floating gate, a control gate, and a source connected through a channel to a drain, said cells in said sector further being situated within a first well having a first conductivity type, and the first well being situated within a second well having a second conductivity, and said second well being situated within a substrate, such that said second well, first well and source and/or drain form a bipolar device, said method including the step of:

biasing the bipolar device and said cells in said sector such that a conditioning current is caused to flow through such first and second wells and is injected into the floating gate of all of said cells in said sector;

wherein threshold voltage variations of said cells in said sector are minimized by the operative effect of the conditioning current being applied to such cells at approximately the same time.

11. The method of claim 10, wherein said floating gate, source and drain of said cell are positively biased during the time said conditioning current flows.

12. The method of claim 10, wherein said cells in said sector are reverse-biased with respect to said well during the time said conditioning current is flowing.

13. The method of claim 10 wherein all of said threshold voltages of said cells in such sector are adjusted in less than 100 milliseconds.

14. The method of claim 10 wherein said cells operate at a nominal voltage less than or equal to 3 volts, and a charge pump is not used to generate the conditioning current.

15. The method of claim 10, wherein the conditioning current operates to place such cells in such sector into a pre-programmed state.

16. The method of claim 15, further including a step of applying a conditioning signal to reduce a voltage threshold of said cells so that they are placed into an erased state.

17. The method of claim 16, further including a step of applying a data programming signal to said cells to place them into a programmed state corresponding to data values to be stored in said cells.

18. A flash memory cell for use in a flash memory cell array, said cell being situated in a first well having a first conductivity, and such that the first well is situated within a second well having a second conductivity type, said cell comprising:

a floating gate for storing a cell electrical charge, which charge determines a threshold voltage for such cell, and which charge also determines a state for said cell;

a control gate for applying a cell threshold voltage conditioning signal; and a source and a drain that are interconnected through a cell channel; and wherein the electrical charge in said cell can be adjusted by a pre-programming current injected from the second well and through the first well into the floating gate in combination with the voltage conditioning signal; and further wherein said pre-programming current does not rely on hot carrier current to set the cell into a pre-programmed state.

19. The flash memory cell of claim 18, further wherein generation of hot electrons in said channel is minimized when said cell is placed in a pre-programmed state.

20. The flash memory cell of claim 18, wherein the electrical charge in said cell can be adjusted by an erase signal to place such cell into an erased state after said cell has been placed into a pre-programmed state.

21. The flash memory cell of claim 18, wherein the floating gate, source and drain of said cell can be positively biased relative to said first well to enhance the amount of current injected into the floating gate.

22. The flash memory cell of claim 18, wherein said cell can be set to a pre-programmed state in less than 2 microseconds.

23. The flash memory cell of claim 18, wherein said cell operates at a nominal voltage less than or equal to 3 volts, and a charge pump is not used to generate the injected current.

24. A flash memory cell array comprising:

a plurality of sectors, each of said sectors including electrically alterable cells situated in a first well having a first conductivity and where said first well is situated in a second well having a second conductivity; and each of the cells in the sectors including:

i) a floating gate for storing a cell electrical charge, which charge determines a threshold voltage for such cell, and which charge also determines whether said cell is in a pre-programmed state or a non-pre-programmed state; and ii) a control gate for applying a threshold voltage conditioning signal; and iii) a source and a drain that are interconnected through a cell channel; and wherein the electrical charge in each of the cells can be adjusted at approximately the same time for a sector by current injected from said second well through said first well into the floating gate when said voltage conditioning signal is applied so that each of said cells is placed into a pre-programmed state, and which injected current does not rely on hot carriers for setting said threshold voltage to a pre-programmed state.

25. The array of claim 24, wherein generation of hot electrons in the channel is minimized when said cells in the sector are placed in a pre-programmed state.

26. The array of claim 24, wherein the electrical charge of the floating gates of cells in the sector can be adjusted by an erase signal to place such cell into an erased state after the cell has been placed into a pre-programmed state.

27. The array of claim 24, wherein said floating gate, source and drain of cells within the sector are positively biased when the conditioning signal is generated.

28. The array of claim 24, wherein the cells can be reverse-biased with respect to the first well during the time the electrical charge is adjusted.

29. The array of claim 24, wherein the cells in a sector can be pre-programmed in less than 100 milliseconds.

30. The array of claim 24, wherein the cells operate at a nominal voltage less than or equal to 3 volts, and a charge pump is not used to generate the injected current.

31. The array of claim 24, wherein said conditioning signal is bipolar.

* * * * *